(12) United States Patent
Terasaki et al.

(10) Patent No.: US 10,199,237 B2
(45) Date of Patent: *Feb. 5, 2019

(54) METHOD FOR MANUFACTURING BONDED BODY AND METHOD FOR MANUFACTURING POWER-MODULE SUBSTRATE

(71) Applicant: MITSUBISHI MATERIALS CORPORATION, Tokyo (JP)

(72) Inventors: Nobuyuki Terasaki, Saitama (JP); Yoshiyuki Nagatomo, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 28 days.

This patent is subject to a terminal disclaimer.

(21) Appl. No.: 14/775,819

(22) PCT Filed: Mar. 17, 2014

(86) PCT No.: PCT/JP2014/057121
§ 371 (c)(1),
(2) Date: Sep. 14, 2015

(87) PCT Pub. No.: WO2014/148425
PCT Pub. Date: Sep. 25, 2014

(65) Prior Publication Data
US 2016/0013073 A1    Jan. 14, 2016

(30) Foreign Application Priority Data

Mar. 18, 2013 (JP) ................................. 2013-055517

(51) Int. Cl.
*H01L 21/48*    (2006.01)
*H01L 23/373*    (2006.01)
(Continued)

(52) U.S. Cl.
CPC ........ *H01L 21/4853* (2013.01); *C04B 37/026* (2013.01); *H01L 23/3735* (2013.01);
(Continued)

(58) Field of Classification Search
CPC ... C04B 37/02; C04B 37/026; H01L 21/4853; H01L 23/3735; H01L 23/473
See application file for complete search history.

(56) References Cited

U.S. PATENT DOCUMENTS 5,378,294 A    1/1995    Rissanen
5,561,321 A    10/1996   Hirano et al.
(Continued)

FOREIGN PATENT DOCUMENTS

CN    102922828 A        2/2013
EP         0153618 A2 *  9/1985 ........... C04B 35/645
(Continued)

OTHER PUBLICATIONS

Brazetec 5662 "Technical Data Sheet" (Oct. 11, 2006).*
(Continued)

*Primary Examiner* — Alex B Efta
(74) *Attorney, Agent, or Firm* — Locke Lord LLP (57) ABSTRACT

A method for manufacturing a power-module substrate includes a lamination step of laminating a ceramic member and a copper member through an active metal material and a filler metal having a melting point of 710° C. or lower, and a heating treatment step of heating the ceramic member and the copper member laminated together.

23 Claims, 6 Drawing Sheets

(51) Int. Cl.
 *H01L 23/473* (2006.01)
 *C04B 37/02* (2006.01)

(52) U.S. Cl.
 CPC .... *C04B 2237/12* (2013.01); *C04B 2237/121* (2013.01); *C04B 2237/122* (2013.01); *C04B 2237/124* (2013.01); *C04B 2237/127* (2013.01); *C04B 2237/366* (2013.01); *C04B 2237/407* (2013.01); *C04B 2237/708* (2013.01); *C04B 2237/72* (2013.01); *H01L 23/473* (2013.01); *H01L 2224/32225* (2013.01)

(56) References Cited

U.S. PATENT DOCUMENTS

| | | | |
|---|---|---|---|
| 5,807,626 A * | 9/1998 | Naba | B23K 1/0016 |
| | | | 174/259 |
| 6,261,703 B1 * | 7/2001 | Sasaki | H01L 23/3735 |
| | | | 174/256 |
| 6,310,775 B1 | 10/2001 | Nagatomo et al. | |
| 2003/0091463 A1 | 5/2003 | Izumida et al. | |
| 2004/0188828 A1 | 9/2004 | Nagatomo et al. | |
| 2004/0238483 A1 | 12/2004 | Tsukaguchi et al. | |
| 2004/0262367 A1 * | 12/2004 | Nakamura | H01L 23/3735 |
| | | | 228/122.1 |
| 2005/0136270 A1 | 6/2005 | Besnoin et al. | |
| 2005/0249629 A1 * | 11/2005 | Harris | B23K 35/302 |
| | | | 420/472 |
| 2006/0067853 A1 | 3/2006 | Takahashi et al. | |
| 2006/0157862 A1 | 7/2006 | Nishimura et al. | |
| 2007/0007280 A1 | 1/2007 | Bayerer | |
| 2008/0093729 A1 | 4/2008 | Siepe et al. | |
| 2008/0122052 A1 | 5/2008 | Fukui | |
| 2009/0020321 A1 | 1/2009 | Schulz-Harder | |
| 2009/0243089 A1 | 10/2009 | Hohlfeld et al. | |
| 2010/0109016 A1 | 5/2010 | Yagi et al. | |
| 2010/0147571 A1 | 6/2010 | Kluge | |
| 2010/0175756 A1 | 7/2010 | Weihs et al. | |
| 2010/0187020 A1 | 7/2010 | Zhang et al. | |
| 2011/0074010 A1 | 3/2011 | Kuromitsu et al. | |
| 2013/0022836 A1 | 1/2013 | Easley et al. | |
| 2014/0138710 A1 | 5/2014 | Ohtsu et al. | |
| 2015/0034367 A1 | 2/2015 | Nagatomo et al. | |
| 2015/0055302 A1 | 2/2015 | Nagatomo et al. | |
| 2015/0208496 A1 | 7/2015 | Terasaki et al. | |
| 2015/0282379 A1 | 10/2015 | Terasaki et al. | |
| 2015/0313011 A1 | 10/2015 | Terasaki et al. | |
| 2016/0001388 A1 | 1/2016 | Oohiraki et al. | |
| 2016/0013073 A1 | 1/2016 | Terasaki et al. | |
| 2016/0016245 A1 * | 1/2016 | Terasaki | C04B 37/026 |
| | | | 228/123.1 |
| 2016/0035660 A1 | 2/2016 | Terasaki et al. | |

FOREIGN PATENT DOCUMENTS

| | | |
|---|---|---|
| JP | 63-239166 A | 10/1988 |
| JP | 03-297595 A | 12/1991 |
| JP | 07-308794 A | 11/1995 |
| JP | 10-102167 A | 4/1998 |
| JP | 2000-119071 A | 4/2000 |
| JP | 2000-349400 A | 12/2000 |
| JP | 3211856 B2 | 9/2001 |
| JP | 2003-197826 A | 7/2003 |
| JP | 2005-035874 A | 2/2005 |
| JP | 2005-050919 A | 2/2005 |
| JP | 2005-052869 A | 3/2005 |
| JP | 2008-198706 A | 8/2008 |
| JP | 2011-108999 A | 6/2011 |
| JP | 2011-155227 A | 8/2011 |
| JP | 2012-023404 A | 2/2012 |
| JP | 2012-064801 A | 3/2012 |
| JP | 2012-136378 A | 7/2012 |
| JP | 2012-160642 A | 8/2012 |
| JP | 2012-178513 A | 9/2012 |
| JP | 2013-214561 A | 10/2013 |

OTHER PUBLICATIONS

International Search Report dated May 13, 2014, issued for PCT/JP2014/057121 and English translation thereof.
Office Action dated Sep. 9, 2014, issued for the Japanese patent application No. 2013-055517 and English translation thereof.
Office Action dated Jun. 30, 2015, issued for the Japanese patent application No. 2014-227284 and English translation thereof.
Supplementary European Seaerch Report dated Oct. 6, 2016, issued for the European patent application No. 14769861.7.
Office Action dated Aug. 9, 2016 issued for U.S. Appl. No. 14/772,913.
Office Action dated Nov. 28, 2016 issued for U.S. Appl. No. 14/772,913.
Office Action dated Apr. 13, 2017 issued for U.S. Appl. No. 14/772,913.
Office Action dated Nov. 29, 2017 issued for corresponding Chinese Patent Application No. 201480012947.2.
International Search Report dated May 13, 2014, issued for PCT/JP2014/057098 and English translation thereof. (Cited in U.S. Appl. No. 14/772,913).
European search report dated Sep. 29, 2016 for EP Application No. 14767678.7 (Cited in U.S. Appl. No. 14/772,913).
Search Report dated Mar. 22, 2017, issued for CN Patent Application No. 201480012586.1, with English translation of part of the search report. (Cited in U.S. Appl. No. 14/772,913).
Notice of Allowance issued by Examiner Michihiro Asakawa, of the Japanese Patent Office, dated Feb. 14, 2017, in Japanese Patent Application No. 2013-055518. (Cited in U.S. Appl. No. 14/772,913).

* cited by examiner

METHOD FOR MANUFACTURING BONDED BODY AND METHOD FOR MANUFACTURING POWER-MODULE SUBSTRATE

TECHNICAL FIELD

The present invention relates to a method for manufacturing a bonded body formed by bonding a ceramic member and a copper member, and a method for manufacturing a power-module substrate in which a circuit layer or a metal layer made of copper or a copper alloy is bonded to a ceramic substrate.

Priority is claimed on Japanese Patent Application No. 2013-055517, filed Mar. 18, 2013, the content of which is incorporated herein by reference.

BACKGROUND ART OF THE INVENTION

A semiconductor device such as an LED or a power-module has a structure in which a semiconductor element is bonded onto a circuit layer made of a conductive material.

In a power semiconductor element for high-power control used to control wind power generation, a transportation system such as an electric automobile and the like, a large amount of heat is generated, and thus, as a substrate mounting the power semiconductor element thereon, for example, a power-module substrate in which a metal sheet having excellent conductive properties is bonded to one surface of a ceramic substrate made of aluminum nitride (AlN) as a circuit layer is widely employed. In addition, in some cases, a metal sheet is bonded to the other surface of the ceramic substrate as a metal layer.

For example, a power-module substrate described in Patent Document 1 has a structure in which copper sheets (copper members) are bonded to both surfaces of a ceramic substrate (ceramic member). In this power-module substrate, the copper sheets are bonded to both surfaces of the ceramic substrate by disposing the copper sheets on the surfaces through Ag—Cu—Ti-based brazing filler metal and carrying out a heating treatment.

Since the above-described Ag—Cu—Ti-based brazing filler metal contains Ti, which is an active metal, when the ceramic substrate and the copper sheets are bonded together through the Ag—Cu—Ti-based brazing filler metal, the wettability between the liquid-phase brazing filler metal and the ceramic substrate becomes favorable, and the ceramic substrate and the copper sheets can be suitably bonded together.

PRIOR ART DOCUMENTS

Patent Documents

Patent Document 1: Japanese Patent No. 3211856

SUMMARY OF THE INVENTION

Technical Problem

As disclosed in Patent Document 1, when the ceramic substrate and the copper sheets are bonded together using the Ag—Cu—Ti-based brazing filler metal, there is a problem in that the high melting point of the Ag—Cu—Ti-based brazing filler metal causes the ceramic substrate to be degraded due to heat.

In addition, there is another problem in that the inclusion of expensive Ag in the Ag—Cu—Ti-based brazing filler metal causes an increase in the manufacturing cost.

The present invention is made in consideration of the above-described circumstances, and an object of the invention is to provide a method for manufacturing a bonded body in which a ceramic member and a copper member can be bonded together at low temperature with low manufacturing cost, and a method for manufacturing a power-module substrate.

Solution to Problem

According to an aspect of the present invention, a method is provided for manufacturing a bonded body formed by bonding a ceramic member made of a ceramic material and a copper member made of copper or a copper alloy, the method including a lamination step of laminating the ceramic member and the copper member through an active metal material and a filler metal having a melting point of 710° C. or lower, and a heating treatment step of heating the ceramic member and the copper member laminated together to bond the ceramic member and the copper member.

In the present invention, the melting point refers to a solidus temperature. In addition, the filler metal refers to a brazing filler metal, a solder material or the like.

According to the method for manufacturing a bonded body of the present invention, the copper member made of copper or a copper alloy is laminated on the ceramic member through the active metal material and the filler metal having a melting point of 710° C. or lower, and the ceramic member and the copper member are heated. During the heating treatment, the active metal is melted into the molten liquid-phase filler metal, the wettability of the liquid-phase filler metal to the ceramic member is enhanced, and the copper member is suitably bonded to the ceramic member through the filler metal after the solidification of the filler metal.

In addition, since the melting point of the filler metal is set to 710° C. or lower, it is possible to make the filler metal form a liquid phase at a temperature lower than in a case in which the Ag—Cu—Ti-based filler metal is used. When a heating treatment is carried out in the above-described low temperature range, it is possible to mitigate the thermal load on the ceramic member.

Furthermore, since the ceramic member and the copper member are bonded together using a filler metal not containing Ag, it is possible to reduce the manufacturing cost more than in a case in which the Ag—Cu—Ti-based brazing filler metal is used.

In addition, in the lamination step, the filler metal may be disposed on the ceramic member, and the active metal material may be disposed on the copper member.

In the above-described case, it is possible to bond the copper member and the active metal material through solid-phase diffusion bonding during the heating treatment, and it becomes possible to suppress the generation of bumps on the bonding interface caused by the generation of the liquid phases of Cu and the active metal in the bonding interface and a change in the thickness. In addition, since the active metal is interposed between the liquid-phase filler metal and the copper member, the liquid-phase filler metal does not come into direct contact with the copper member, and it is possible to reliably suppress the generation of bumps on the bonding interface and a change in the thickness.

As described above, since the filler metal is suitably bonded to the ceramic substrate, and the active metal material and the copper member are bonded together through solid-phase diffusion bonding, it is possible to suitably bond the ceramic member and the copper member under a low temperature condition, and it is possible to suppress the thermal degradation of the ceramic member.

In addition, in the above-described method for manufacturing a bonded body, the filler metal may be a brazing filler metal having a liquidus temperature of 450° C. or higher.

Specifically, the brazing filler metal may be any one selected from a Cu—P-based brazing filler metal, a Cu—Sn-based brazing filler metal, and a Cu—Al-based brazing filler metal.

In a case in which the above-described brazing filler metal is used, it is possible to reliably bond the ceramic member and the copper member under a low temperature condition due to the low melting point of the brazing filler metal.

As the Cu—P-based brazing filler metal, it is possible to use, for example, a Cu—P brazing filler metal, a Cu—P—Sn brazing filler metal, a Cu—P—Sn—Ni-based brazing filler metal or the like.

In addition, in the above-described method for manufacturing a bonded body, the filler metal may be a solder material having a liquidus temperature of lower than 450° C. Specifically, the solder material may be a Cu—P—Sn—Ni-based solder material or a Cu—Sn-based solder material.

In a case in which the above-described solder material is used, the solder material has a lower melting point than the brazing filler metal, and thus it is possible to bond the ceramic member and the copper member under a lower temperature condition.

In addition, in the above-described method for manufacturing a bonded body, the active metal material may be a Ti material. In such a case, Ti is melted into the liquid-phase filler metal, and thus the surface of the ceramic substrate can be reliably wetted with the liquid-phase filler metal, and it becomes possible to reliably bond the ceramic member and the copper member.

An aspect of a method for manufacturing a power-module substrate of the present invention is a method for manufacturing a power-module substrate having a ceramic substrate and a circuit layer made of copper or a copper alloy, the circuit layer being disposed on one surface of the ceramic substrate, in which the circuit layer is bonded onto the one surface of the ceramic substrate using the above-described method for manufacturing the bonded body. Therefore, it is possible to form the circuit layer at a relatively low temperature, and thus degradation of the ceramic substrate during bonding can be suppressed.

In addition, another aspect of the method for manufacturing a power-module substrate of the present invention is a method for manufacturing a power-module substrate having a ceramic substrate, a circuit layer made of copper or a copper alloy, and a metal layer made of copper or a copper alloy, the circuit layer being disposed on one surface of the ceramic substrate, and the metal layer being disposed on the other surface of the ceramic substrate, in which the ceramic substrate and the circuit layer may be bonded together using the above-described method for manufacturing a bonded body. After bonding the circuit layer to one surface of the ceramic substrate, the metal layer may be bonded to the other surface of the ceramic substrate. Therefore, it is possible to form the circuit layer at a relatively low temperature, and thus degradation of the ceramic substrate during bonding can be suppressed.

In addition, the method for manufacturing a power-module substrate of the present invention is a method for manufacturing a power-module substrate having a ceramic substrate, a circuit layer made of copper or a copper alloy, and a metal layer made of copper or a copper alloy, the circuit layer being disposed on one surface of the ceramic substrate, and the metal layer being disposed on the other surface of the ceramic substrate, in which the circuit layer and the metal layer may be bonded onto both surfaces of the ceramic substrate respectively using the above-described method for manufacturing the bonded body. Therefore, it is possible to form the circuit layer at a relatively low temperature, and thus degradation of the ceramic substrate during bonding can be suppressed.

Advantageous Effects of the Invention

According to the present invention, it is possible to provide a method for manufacturing a bonded body in which a ceramic member and a copper member can be bonded together at a low temperature and the manufacturing cost is low and a method for manufacturing a power-module substrate.

DESCRIPTION OF EMBODIMENTS (First Embodiment)

Hereinafter, embodiments of the present invention will be described with reference to the accompanying drawings. First, a first embodiment of the present invention will be described.

Figure 1:
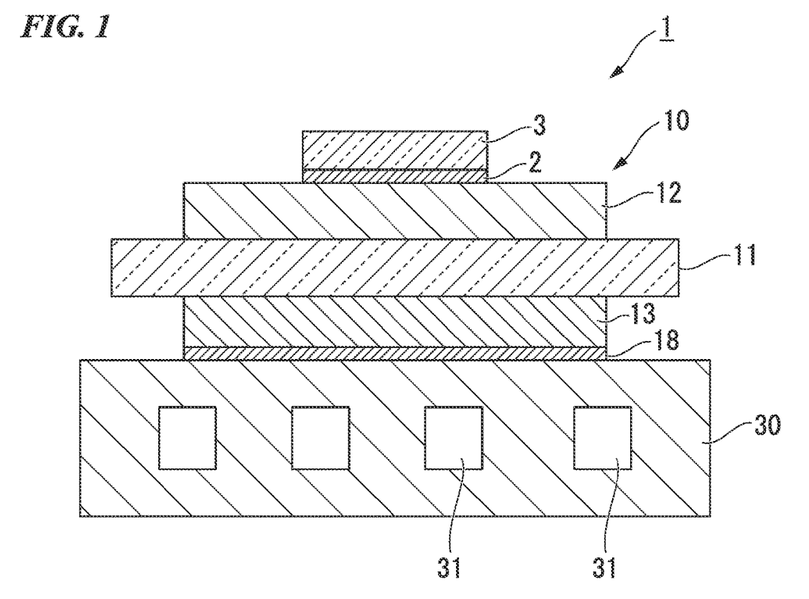
FIG. 1 is a schematic explanatory view of a power-module for which a power-module substrate according to a first embodiment of the present invention is used.

In a method for manufacturing a bonded body of the present embodiment, a power-module substrate 10 is manufactured as a bonded body by bonding a ceramic substrate 11 (ceramic member), a circuit layer 12 (copper member), and a metal layer 13 (copper member). FIG. 1 illustrates a power-module 1 including the power-module substrate 10 of the present embodiment.

This power-module 1 includes the power-module substrate 10 provided with the circuit layer 12, a semiconductor element 3 bonded to one surface (the upper surface in FIG. 1) of the circuit layer 12 through a bonding layer 2, and a heat sink 30 disposed on the other side (the lower side in FIG. 1) of the power-module substrate 10.

Figure 2:
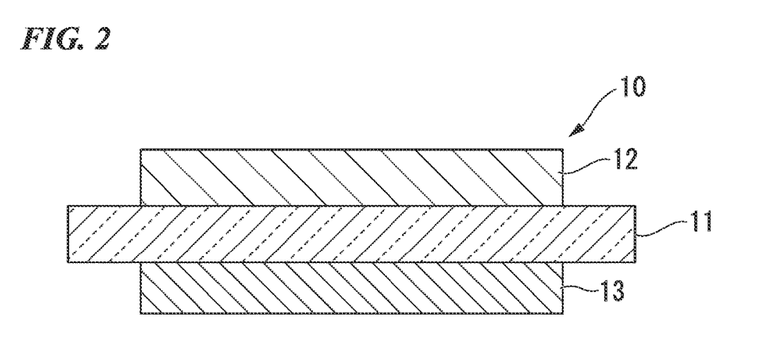
FIG. 2 is a schematic explanatory view of the power-module substrate according to the first embodiment of the present invention.

As illustrated in FIG. 2, the power-module substrate 10 includes the ceramic substrate 11, the circuit layer 12 disposed on one surface (the upper surface in FIG. 2) of the ceramic substrate 11, and the metal layer 13 disposed on the other side (the lower surface in FIG. 2) of the ceramic substrate 11.

The ceramic substrate 11 is made of a highly insulating ceramic material such as aluminum nitride (AlN), silicon nitride ($Si_3N_4$), or alumina ($Al_2O_3$). In the present embodiment, the ceramic substrate 11 is made of aluminum nitride (AlN) having excellent heat-dissipating properties. In addition, the thickness of the ceramic substrate 11 is set in a range of 0.2 mm to 1.5 mm and, in the present embodiment, is set to 0.635 mm.

The circuit layer 12 is formed by bonding a conductive metal sheet of copper or a copper alloy to one surface of the ceramic substrate 11. In the present embodiment, the circuit layer 12 is formed by bonding a rolled sheet of copper having a purity of 99.99% by mass or greater. The thickness of the circuit layer 12 is set in a range of 0.1 mm to 1.0 mm and, in the present embodiment, is set to 0.6 mm.

The metal layer 13 is formed by bonding a metal sheet of copper or a copper alloy to the other surface of the ceramic substrate 11. In the present embodiment, similar to the circuit layer 12, the metal layer 13 is formed by bonding a rolled sheet of copper having a purity of 99.99% by mass or greater. The thickness of the metal layer 13 is set in a range of 0.1 mm to 1.0 mm and, in the present embodiment, is set to 0.6 mm.

The semiconductor element 3 is made of a semiconductor material such as Si. The semiconductor element 3 and the circuit layer 12 are bonded together through the bonding layer 2.

As the bonding layer 2, for example, a Sn—Ag-based solder material, a Sn—In-based solder material, or a Sn—Ag—Cu-based solder material is used.

The heat sink 30 is a device for dissipating heat from the power-module substrate 10. In the present embodiment, the heat sink 30 is made of copper or a copper alloy and, in the present embodiment, is made of oxygen-free copper. The heat sink 30 is provided with flow paths 31 for the flow of a cooling fluid. The heat sink 30 and the metal layer 13 are bonded together through a solder layer 18 made of a solder material.

Figure 3:
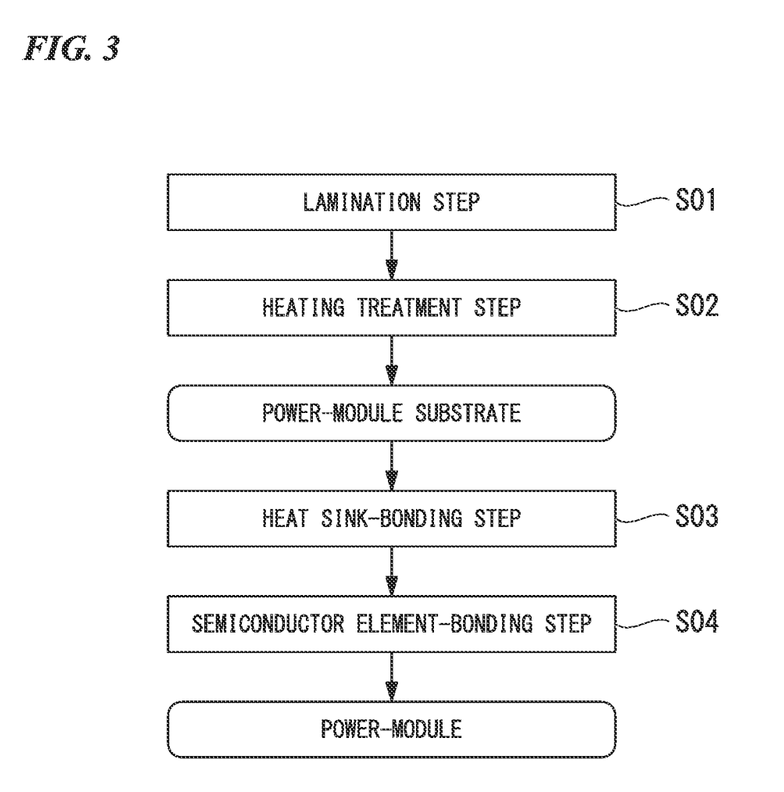
FIG. 3 is a flowchart illustrating a method for manufacturing the power-module substrate according to the first embodiment of the present invention and a method for manufacturing the power-module.

Next, a method for manufacturing the power-module 1 according to the present embodiment will be described with reference to the flowchart of FIG. 3 and FIG. 4.

Figure 4:
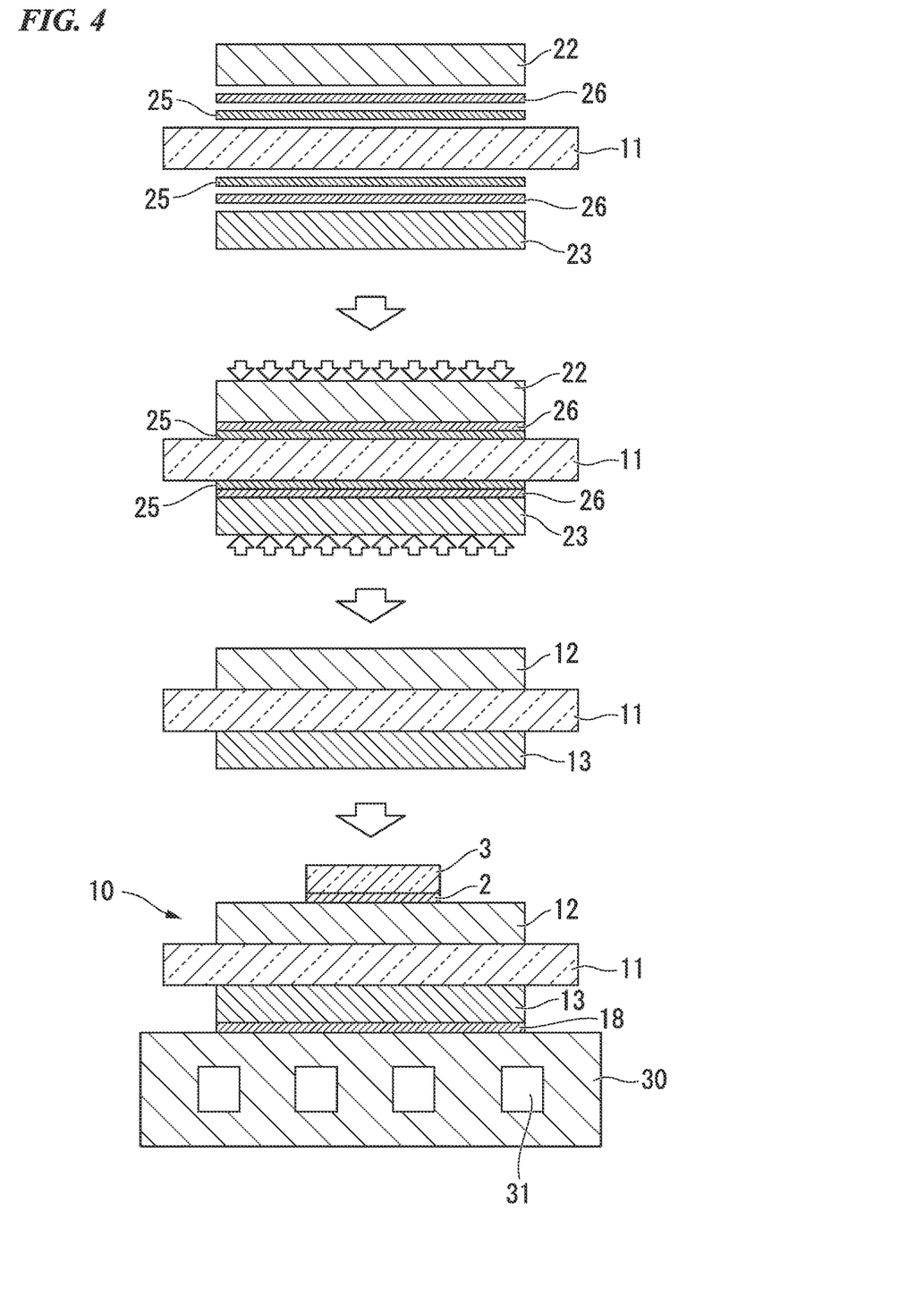
FIG. 4 is a schematic explanatory view of the method for manufacturing the power-module substrate according to the first embodiment of the present invention and the method for manufacturing the power-module.

First, as illustrated in FIG. 4, a filler metal 25, an active metal material 26, and a copper sheet 22 serving as the circuit layer 12 are sequentially laminated on one surface (the upper surface in FIG. 4) of the ceramic substrate 11, and, on the other surface (the lower surface in FIG. 4) of the ceramic substrate 11 as well, as illustrated in FIG. 4, a filler metal 25, an active metal material 26, and a copper sheet 23 serving as the metal layer 13 are sequentially laminated. (lamination step S01). That is, the filler metal 25 is disposed on a ceramic substrate 11 side and the active metal material 26 is disposed on a copper sheet 22 side between the ceramic substrate 11 and the copper sheet 22, and the filler metal 25 is disposed on the ceramic substrate 11 side and the active metal material 26 is disposed on the copper sheet 22 side between the ceramic substrate 11 and the copper sheet 23.

The filler metal 25 indicates a brazing filler metal or a solder material, and a Cu—P-based brazing filler metal, a Cu—Sn-based brazing filler metal, a Cu—P—Sn—Ni-based solder material, or a Cu—Sn-based solder material, which has a melting point of 710° C. or lower, is used. As the Cu—P-based brazing filler metal, for example, a Cu—P brazing filler metal, a Cu—P—Sn brazing filler metal, a Cu—P—Sn—Ni brazing filler metal or the like can be used.

In the present embodiment, a Cu—P—Sn—Ni-based brazing filler metal foil (Cu-7 mass %P-15 mass %Sn-10 mass %Ni) is used as the filler metal 25. The thickness of the filler metal 25 is set in a range of 5 μm to 150 μm.

The active metal material 26 contains one or more active elements such as Ti, Zr Nb, and Hf, and, in the present embodiment, a Ti foil is used as the active metal material 26. The thickness of the active metal material 26 is set in a range of 1 μm to 20 μm.

Next, the ceramic substrate 11, the filler metals 25, the active metal materials 26, and the copper sheets 22 and 23 are loaded and heated in a vacuum-heating furnace in a state of being pressurized in the lamination direction at 1 kgf/cm$^2$ to 35 kgf/cm$^2$ (98 kPa to 3430 kPa) (heating treatment step S02). In the present embodiment, the pressure in the vacuum-heating furnace is set in a range of $10^{-6}$ Pa to $10^{-3}$ Pa, the heating temperature is set in a range of 560° C. to 650° C., and the heating time is set in a range of 30 minutes to 360 minutes.

In the heating treatment step S02, the active metal materials 26 (Ti foils) and the copper sheets 22 and 23 are bonded together through solid-phase diffusion bonding, and the ceramic substrates 11 and the active metal materials 26 are bonded together through the filler metals 25 in a manner that the filler metal 25 is melted so as to form a liquid phase and the liquid phase is solidified. The bonded surfaces between the active metal materials 26 and the copper sheets 22 and 23, which are bonded together through solid-phase diffusion bonding, are already worked into flat surfaces.

Therefore, the circuit layer 12 (copper member) and the metal layer 13 (copper member) are formed on either surface of the ceramic substrate 11 (ceramic member), thereby manufacturing the power-module substrate 10 (bonded body) of the present embodiment.

Next, the heat sink 30 is bonded to the lower surface of the metal layer 13 in the power-module substrate 10 through a solder material (heat sink-bonding step S03).

Next, the semiconductor element 3 is bonded to the upper surface of the circuit layer 12 in the power-module substrate 10 through a solder material (semiconductor element-bonding step S04).

Thereby, the power-module 1 of the present embodiment is manufactured.

According to the method for manufacturing the power-module substrate according to the present embodiment, since a heating treatment is carried out in a state in which the filler metals 25 having a melting point of 710° C. or lower are disposed on the ceramic substrate 11 side and the active metal materials 26 (Ti materials in the present embodiment) are disposed on the copper sheet 22 and 23 sides between the ceramic substrate 11 and the copper sheets 22 and 23, during heating, Ti is melted into the molten liquid-phase filler metal 25, the wettability of the liquid-phase filler metal 25 to the ceramic substrate 11 is enhanced, and the copper sheet 22 is bonded to the ceramic substrate 11 through the filler metal 25 after the solidification of the filler metal 25, whereby favorable bonding reliability is obtained.

In addition, in the present embodiment, since the active metal materials 26 and the copper sheets 22 and 23 are heated and maintained at a temperature in a range of 560° C. to 650° C. in a state of being laminated and pressurized together, Ti atoms in the active metal materials 26 diffuse into the copper sheets 22 and 23, and copper atoms in the copper sheets 22 and 23 diffuse into the active metal materials 26, whereby it is possible to bond the active metal materials 26 and the copper sheets 22 and 23 through solid-phase diffusion bonding.

In a case in which the heating temperature is 560° C. or higher, it is possible to accelerate the diffusion of Ti atoms in the active metal materials 26 and copper atoms in the copper sheets 22 and 23 and sufficiently diffuse the Ti atoms and the copper atoms in a solid phase within a short period of time. In addition, in a case in which the heating temperature is 650° C. or lower, it is possible to suppress the generation of bumps on the bonding interface caused by the generation of a liquid phase between the active metal materials 26 and the copper sheets 22 and 23 and a change in the thickness. Therefore, the heating temperature is set in the above-described range.

In addition, in the heating treatment step S02, in a case in which the pressure applied in the lamination direction is 1 kgf/cm$^2$ (98 kPa) or higher, the active metal materials 26 and the copper sheets 22 and 23 can be sufficiently bonded together, and it is possible to suppress the generation of voids between the active metal materials 26 and the copper sheets 22 and 23 (the circuit layer 12 and the metal layer 13). In addition, in a case in which the pressure loaded is 35 kgf/cm$^2$ (3430 kPa) or lower, it is possible to suppress the generation of cracks in the ceramic substrate 11. Therefore, the pressure applied is set in the above-described range.

In addition, since the melting point of the filler metal 25 is set to 710° C. or lower, it is possible to make the filler metal form a liquid phase at a lower temperature than in a case in which the Ag—Cu—Ti-based brazing filler metal is used.

Furthermore, since the active metal materials 26 are interposed between the filler metals 25 and the copper sheets 22 and 23, the liquid-phase filler metals 25 do not come into direct contact with the copper sheets 22 and 23, and it is possible to suppress the generation of bumps on the bonding interface and a change in the thickness.

As described above, since the filler metals 25 are suitably bonded to the ceramic substrate 11, and the active metal materials 26 and the copper sheets 22 and 23 are bonded together through solid-phase diffusion bonding, the ceramic substrate 11 and the copper sheets 22 and 23 can be suitably bonded together, and it is possible to improve the bonding reliability between the ceramic substrate 11 and the circuit layer 12 and the metal layer 13.

Furthermore, since the ceramic substrate 11 and the copper sheets 22 and 23 are bonded together using the filler metals 25 which do not contain Ag, it is possible to reduce the manufacturing cost more than in a case in which the Ag—Cu—Ti-based brazing filler metal is used.

In addition, in the present embodiment, since the circuit layer 12 and the metal layer 13 are bonded to either surface of the ceramic substrate 11 at the same time, it is possible to simplify manufacturing steps and reduce the manufacturing cost.

Furthermore, since the surfaces to be bonded of the active metal materials 26 and the copper sheets 22 and 23 are already worked into flat surfaces, it is possible to suppress the generation of voids in the bonding interface, and the active metal materials 26 and the copper sheets 22 and 23 can be reliably bonded together.

In addition, according to the power-module substrate 10 and the power-module 1 of the present embodiment, since the circuit layer 12 made of the copper sheet 22 is formed on one surface of the ceramic substrate 11, it is possible to spread and dissipate heat from the semiconductor element 3 toward the ceramic substrate 11. In addition, since the copper sheet 22 has strong deformation resistance, when a heat cycle is loaded, the deformation of the circuit layer 12 is suppressed, the deformation of the bonding layer 2 bonding the semiconductor element 3 and the circuit layer 12 is suppressed, and the bonding reliability can be improved.

In addition, since the metal layer 13 made of the copper sheet 23 is formed on the other surface of the ceramic substrate 11, it is possible to efficiently transmit heat from the semiconductor element 3 toward the heat sink 30.

(Second Embodiment)

Next, a second embodiment of the present invention will be described. The same constitution as in the first embodiment will be given the same reference signs and will not be described in detail.

Figure 5:
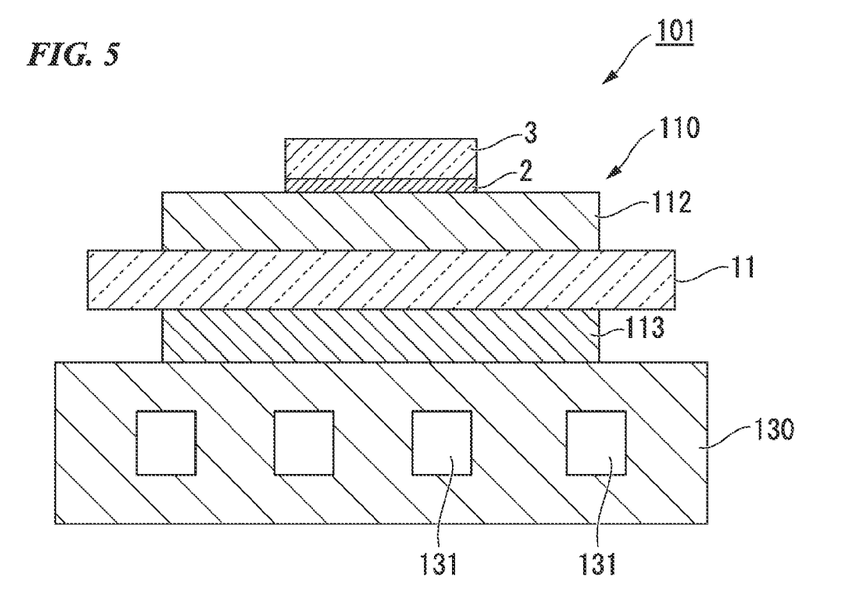
FIG. 5 is a schematic explanatory view of a power-module for which a power-module substrate according to a second embodiment of the present invention is used.

FIG. 5 illustrates a power-module 101 provided with a power-module substrate 110 of the second embodiment.

The power-module 101 includes the power-module substrate 110 provided with a circuit layer 112, the semiconductor element 3 bonded to one surface (the upper surface in FIG. 5) of the circuit layer 112 through the bonding layer 2, and a heat sink 130 disposed on the other side (the lower side in FIG. 5) of the power-module substrate 110.

As illustrated in FIG. 5, the power-module substrate 110 includes the ceramic substrate 11, the circuit layer 112 disposed on one surface (the upper surface in FIG. 5) of the ceramic substrate 11, and a metal layer 113 disposed on the other side (the lower surface in FIG. 5) of the ceramic substrate 11.

The circuit layer 112 is formed by bonding a conductive metal sheet of copper or a copper alloy to one surface of the ceramic substrate 11. In the present embodiment, the circuit layer 112 is formed by bonding a rolled sheet of copper having a purity of 99.99% by mass or greater. The thickness of the circuit layer 112 is set in a range of 0.1 mm to 1.0 mm and, in the present embodiment, is set to 0.4 mm.

The metal layer 113 is formed by bonding a metal sheet of aluminum or an aluminum alloy to the other surface of the ceramic substrate 11. In the second embodiment, the metal layer 13 is formed by bonding a rolled sheet of aluminum having a purity of 99.99% by mass or greater. The thickness of the metal layer 113 is set in a range of 0.1 mm to 3.0 mm and, in the present embodiment, is set to 2.1 mm.

The heat sink 130 is a device for dissipating heat from the power-module substrate 110. In the present embodiment, the heat sink 130 is made of aluminum or an aluminum alloy and, in the present embodiment, is made of A6063 (an aluminum alloy). The heat sink 130 is provided with flow paths 131 for the flow of a cooling fluid. The heat sink 130 and the metal layer 113 are bonded together through an Al—Si-based brazing filler metal.

Figure 6:
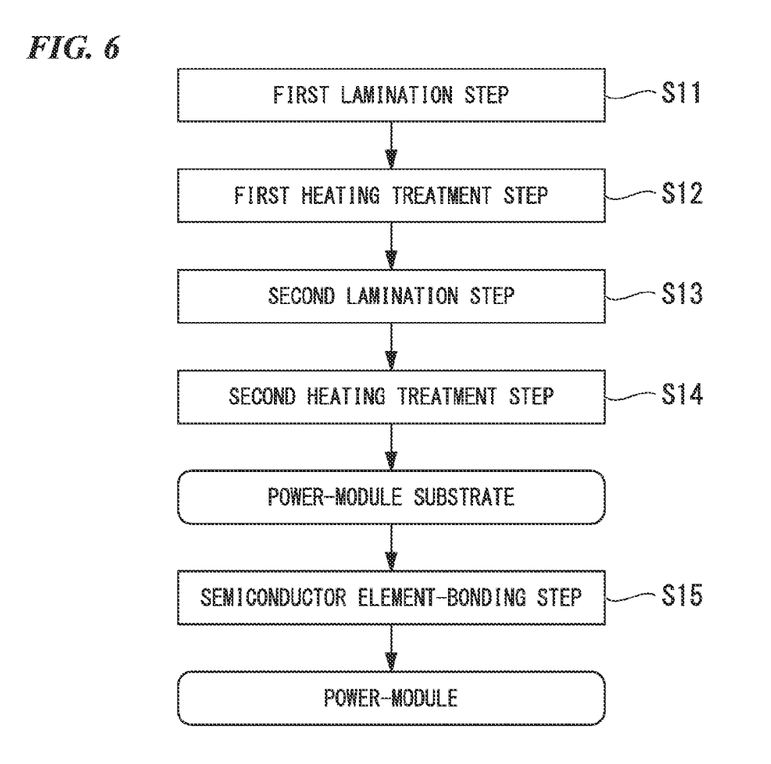
FIG. 6 is a flowchart illustrating a method for manufacturing the power-module substrate according to the second embodiment of the present invention and a method for manufacturing the power-module.

Next, a method for manufacturing the power-module 101 according to the present embodiment will be described with reference to the flowchart of FIG. 6 and FIG. 7.

Figure 7:
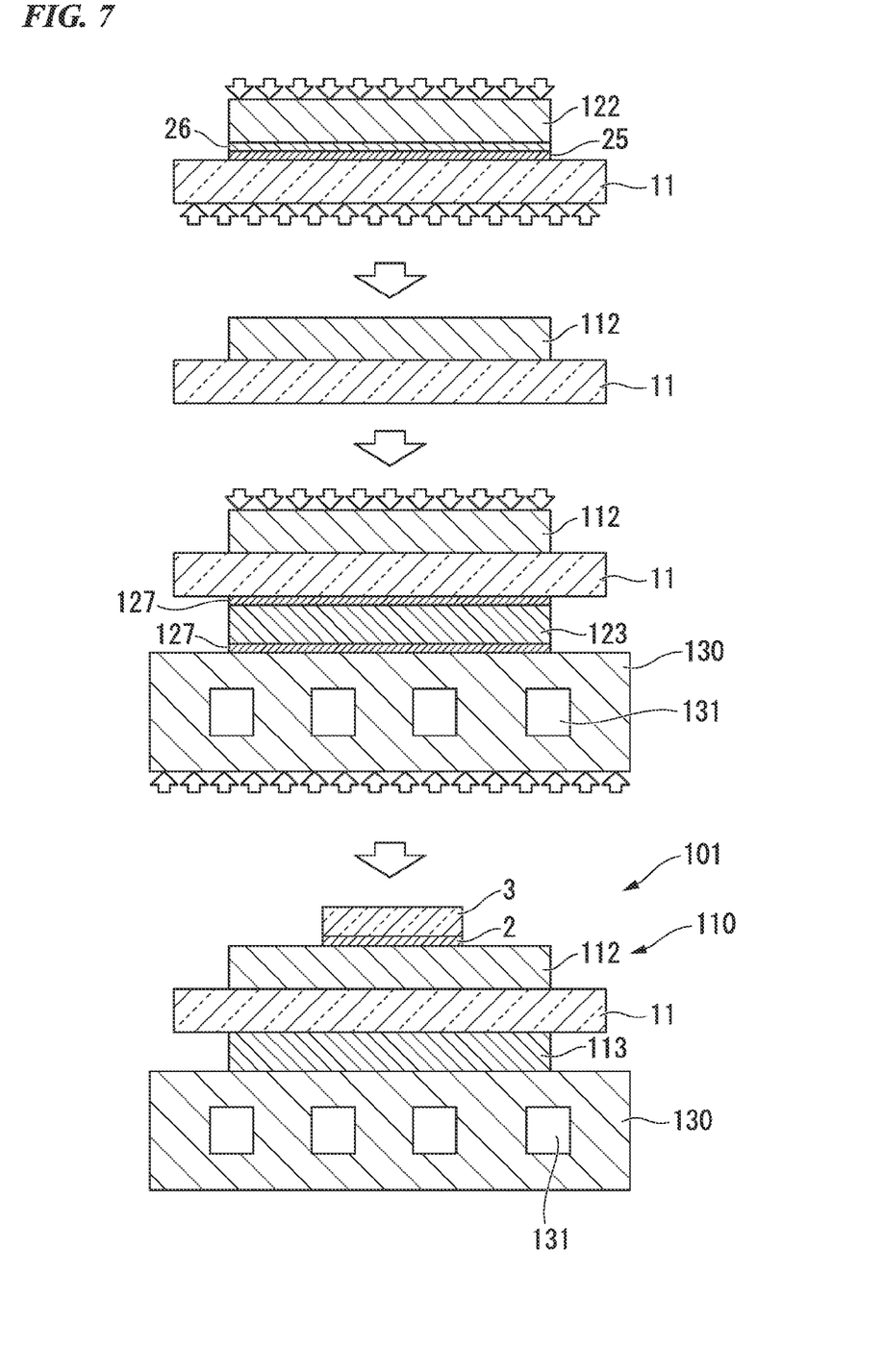
FIG. 7 is a schematic explanatory view of the method for manufacturing the power-module substrate according to the second embodiment of the present invention and the method for manufacturing the power-module.

First, as illustrated in FIG. 7, the filler metal 25, the active metal material 26, and a copper sheet 122 serving as the circuit layer 112 are sequentially laminated on one surface (the upper surface in FIG. 7) of the ceramic substrate 11 (first lamination step S11). That is, the filler metal 25 is disposed on the ceramic substrate 11 side and the active metal material 26 is disposed on the copper sheet 122 side between the ceramic substrate 11 and the copper sheet 122.

In the second embodiment, a Cu—P—Sn—Ni-based brazing filler metal foil (Cu-7 mass %P-15 mass %Sn-10 mass %Ni) is used as the filler metal 25. The thickness of the filler metal 25 is set in a range of 5 μm to 150 μm.

In addition, in the second embodiment, a Ti foil is used as the active metal material 26. The thickness of the active metal material 26 is set in a range of 1 μm to 20 μm.

Next, the ceramic substrate 11, the filler metals 25, the active metal materials 26, and the copper sheet 122 are loaded and heated in a vacuum-heating furnace in a state of being pressurized in the lamination direction at a pressure in a range of 1 kgf/cm² to 35 kgf/cm² (98 kPa to 3430 kPa) (first heating treatment step S12). In the present embodiment, the pressure in the vacuum-heating furnace is set in a range of $10^{-6}$ Pa to $10^{-3}$ Pa, the heating temperature is set in a range of 560° C. to 650° C., and the heating time is set in a range of 30 minutes to 360 minutes.

Therefore, the copper sheet 122 is bonded to one surface of the ceramic substrate 11, thereby forming the circuit layer 112.

Next, an aluminum sheet 123 made of the metal layer 113 is laminated on the other surface (the lower surface in FIG. 7) of the ceramic substrate 11 through an Al—Si-based brazing filler metal 127 as illustrated in FIG. 7 (second lamination step S13). In the second embodiment, in the second lamination step S13, the heat sink 130 was further laminated below the aluminum sheet 123 through the Al—Si-based brazing filler metal 127 as illustrated in FIG. 7.

Next, the ceramic substrate 11, the aluminum sheet 123, and the heat sink 130 are loaded and heated in a vacuum-heating furnace in a state of being pressurized in the lamination direction at 1 kgf/cm² to 35 kgf/cm² (98 kPa to 3430 kPa) (second heating treatment step S14). In the present embodiment, the pressure in the vacuum-heating furnace is set in a range of $10^{-6}$ Pa to $10^{-3}$ Pa, the heating temperature is set in a range of 600° C. to 650° C., and the heating time is set in a range of 30 minutes to 180 minutes.

Therefore, the aluminum sheet 123 is bonded to the other surface of the ceramic substrate 11, thereby forming the metal layer 113, thereby manufacturing the power-module substrate 110 of the second embodiment, and furthermore, the heat sink 130 is bonded to the lower side of the power-module substrate.

Next, the semiconductor element 3 is bonded to the upper surface of the circuit layer 112 in the power-module substrate 110 through a solder material (semiconductor element-bonding step S15).

Therefore, the power-module 101 of the second embodiment is manufactured.

According to the method for manufacturing the power-module substrate 110 of the present embodiment, since a heating treatment is carried out in a state in which the filler metals 25 having a melting point of 710° C. or lower are disposed on the ceramic substrate 11 side and the active metal materials 26 (Ti materials) are disposed on the copper sheet 122 side between the ceramic substrate 11 and the copper sheet 122, during heating, Ti is melted into the molten liquid-phase filler metal 25, and the wettability of the liquid-phase filler metal 25 to the ceramic substrate 11 becomes favorable.

Therefore, when the liquid-phase filler metal 25 is solidified, the bonding reliability between the filler metal 25 and the ceramic substrate 11 improves.

In addition, in the present embodiment, since the active metal material 26 and the copper sheet 122 are heated and maintained at a temperature in a range of 560° C. to 650° C. in a state of being laminated and pressurized together, it is possible to bond the active metal materials 26 and the copper sheet 122 through solid-phase diffusion bonding.

Furthermore, according to the power-module substrate 110 and the power-module 101, since the metal layer 113 made of the aluminum sheet 123 is formed on the other surface of the ceramic substrate 11, when a thermal cycle is loaded, it is possible to absorb thermal stress generated between the power-module substrate 110 and the heat sink 130 using the metal layer 113, and it is possible to suppress the generation of cracks in the ceramic substrate 11.

Thus far, the embodiments of the present invention have been described, but the present invention is not limited thereto and can be modified in an appropriate manner within the scope of the technical concept of the present invention.

In the above-described embodiments, the case in which the metal layer is formed on the other surface of the ceramic substrate is described, although the metal layer need not be formed.

In the above-described embodiments, the case in which a Cu—P—Sn—Ni-based brazing filler metal having a melting point of 710° C. or lower is used as the filler metal is described, but a brazing filler metal having a melting point (solidus temperature) of 710° C. or lower and having a liquidus temperature of 450° C. or higher may be used as the filler metal. Specifically, this brazing filler metal may be any one selected from a Cu—P-based brazing filler metal, a Cu—Sn-based brazing filler metal, and a Cu—Al-based brazing filler metal. As the Cu—P-based brazing filler metal, it is possible to use, for example, a Cu—P brazing filler metal, a Cu—P—Sn brazing filler metal or the like. In a case in which the above-described brazing filler metal is used, it is possible to reliably bond the ceramic member and the copper member under a low temperature condition due to the low melting point of the brazing filler metal.

In addition, a solder material having a liquidus temperature of lower than 450° C. may be used as the filler metal. Specifically, the solder material may be a Cu—P—Sn—Ni-based solder material or a Cu—Sn-based solder material. In a case in which the above-described solder material is used, the solder material has a lower melting point than the brazing filler metal, and thus it is possible to bond the ceramic member and the copper member under a lower temperature condition.

Figure 8:
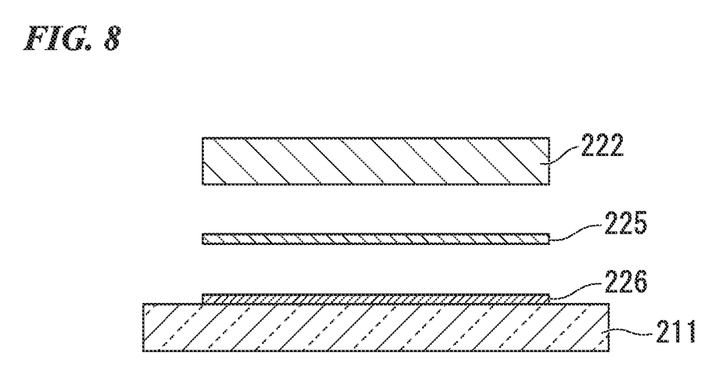
FIG. 8 is a schematic explanatory view of a method for manufacturing a power-module substrate according to another embodiment of the present invention.

In addition, when the active metal materials are disposed on the ceramic member side, the brazing filler metals are disposed on the copper member sides, and the heating treatment is carried out, it is also possible to bond the ceramic member and the copper member. For example, as illustrated in FIG. 8, when an active metal material 226 is disposed on a ceramic member 211 through sputtering or the like, a filler metal 225 is disposed between the active metal material 226 and a copper member 222, and a heating treatment is carried out in a state in which the active metal material and the filler metal are laminated and pressured in the lamination direction, the active metal material 226 and the copper member 222 can be bonded together.

In addition, in the above-described embodiments, the case in which the heat sink is bonded to the other surface of the power-module substrate is described, although the heat sink need not be bonded.

In addition, in the above-described embodiments, the case in which the power-module substrate and the heat sink are bonded together using a solder material or a brazing filler metal is described, but the power-module substrate and the heat sink may be fixed to each other using grease or screws.

In addition, in the second embodiment, the case in which the metal layer and the heat sink are bonded together at the same time is described, but it may be also possible to bond the metal layer first and then bond the heat sink to the metal layer.

EXAMPLES

Hereinafter, the results of a confirmation test carried out to confirm the effects of the present invention will be described.

In each of Invention Examples 1 to 10, a filler metal, an active metal material, and a copper sheet made of copper having a purity of 99.99% (37 mm×37 mm×0.3 mmt (thickness)), which are described in Table 1, are laminated on either surface of a ceramic substrate made of AlN (40 mm×40 mm×0.635 mmt).

In Invention Example 11, a filler metal, an active metal material, and a copper sheet made of copper having a purity of 99.99% (37 mm×37 mm×0.3 mmt), which are described in Table 1, are laminated/1 on one surface of a ceramic substrate made of AlN (40 mm×40 mm×0.635 mmt).

In each of Invention Examples 1 to 9 and Invention Example 11 in which the position of the active metal is set on the copper member side (copper sheet side), the ceramic substrate, the filler metal, the active metal material, and the copper sheet were laminated in this order, and, in Invention Example 10 in which the position of the active metal is set on the ceramic substrate side, the ceramic substrate, the active metal material, the filler metal, and the copper sheet were laminated in this order.

In addition, in Invention Examples 1 to 10, the components were loaded and heated in a vacuum-heating furnace in a state of being pressurized in the lamination direction at a pressure of 15 kgf/cm$^2$ (1470 kPa), whereby copper sheets were bonded to either surface of the ceramic substrate, and a circuit layer and a metal layer were formed. The pressure in the vacuum-heating furnace was set in a range of $10^{-6}$ Pa to $10^{-3}$ Pa, and the heating temperature and the heating time were set to the conditions described in Table 1. Therefore, power-module substrates of Invention Examples 1 to 9 were obtained.

In Invention Example 11, the components were loaded and heated in a vacuum-heating furnace in a state of being pressurized in the lamination direction at a pressure of 15 kgf/cm$^2$ (1470 kPa), whereby a copper sheet was bonded to one surface of the ceramic substrate, and a circuit layer was formed. The pressure in the vacuum-heating furnace was set in a range of $10^{-6}$ Pa to $10^{-3}$ Pa, and the heating temperature and the heating time were set to the conditions described in Table 1. After cooling, an aluminum sheet having a purity of 99.99% was laminated on the other surface of the ceramic substrate through an Al—Si-based brazing filler metal, the components were loaded and heated in a vacuum-heating furnace at 640° C. for 30 minutes in a state of being pressurized in the lamination direction at a pressure of 5 kgf/cm$^2$ (490 kPa), whereby an aluminum sheet was bonded to the other surface of the ceramic substrate, and a power-module substrate of Invention Example 11 was obtained.

Next, a heat sink was bonded to the surface of the power-module substrate opposite to the metal layer side. As the heat sink, a copper sheet made of phosphorous-deoxidized copper (50 mm×60 mm×5 mmt) was used. Regarding the bonding conditions, the heat sink was bonded by heating a Sn—Sb-based solder material at 270° C.

Therefore, power-module substrates with a heat sink of Invention Examples 1 to 11 were produced.

For the power-module substrates with a heat sink of the invention examples obtained as described above, the bonding rates between the circuit layer and the ceramic substrate and the bonding rates between the circuit layer and the ceramic substrate after a thermal cycle test were evaluated. The testing method of the thermal cycle and the method for evaluating the bonding rate will be described below.

(Thermal Cycle Test)

In the thermal cycle test, a thermal shock chamber TSB-51 manufactured by ESPEC Corp. was used, and a temperature-change process in which the power-module substrate with a heat sink was maintained in a liquid phase (fluorinert) under a temperature environment of −40° C. for five minutes, then, was heated up to 125° C., was maintained under the same temperature environment for five minutes, and, again, was returned to the temperature environment of −40° C. (one cycle) was carried out for 3000 cycles.

(Evaluation of Bonding Rate Between Ceramic Substrate and Circuit Layer)

For the power-module substrates with a heat sink, the bonding rates in the interfaces between the ceramic substrate and the circuit layer were evaluated using an ultrasonic flaw detector and were computed using the following formula.

The initial bonding area referred to an area to be bonded before bonding, that is, the area of the circuit layer in the present embodiment. Using the ultrasonic flaw detector exfoliation was observed at white portions in the bonding portion, and thus the area of these white portions was considered as the exfoliation area. In a case in which cracks were generated in the ceramic substrate and the circuit layer, these cracks were observed at the white portions by the ultrasonic flaw detector, and the cracks were also evaluated using the exfoliation area.

$$\text{Bonding rate (\%)} = \frac{\text{(Initial bonding area)} - \text{(Exfoliation area)}}{\text{(Initial bonding area)}} \times 100 \quad \text{(Formula 1)}$$

The results of the above-described evaluations are described in Table 1 below.

TABLE 1

| | Components of filler metal | Thickness of filler metal µM | Melting point of filler metal | Position of active metal material | Type of active metal material |
|---|---|---|---|---|---|
| Invention Example 1 | Cu—6.3 mass % P—9.3 mass % Sn—7 mass % Ni | 20 | 600° C. | Copper member side | Ti |
| Invention Example 2 | Cu—7 mass % P—15 mass % Sn—10 mass % Ni | 20 | 580° C. | Copper member side | Ti |

TABLE 1-continued

| | | | | | |
|---|---|---|---|---|---|
| Invention Example 3 | Cu—7 mass % P—15 mass % Sn—10 mass % Ni | 20 | 580° C. | Copper member side | Zr |
| Invention Example 4 | Cu—7 mass % P—15 mass % Sn—10 mass % Ni | 20 | 580° C. | Copper member side | Nb |
| Invention Example 5 | Cu—7 mass % P—15 mass % Sn—10 mass % Ni | 20 | 580° C. | Copper member side | Hf |
| Invention Example 6 | Cu—7 mass % P | 20 | 710° C. | Copper member side | Ti |
| Invention Example 7 | Sn—0.7 mass % Cu—0.03 mass % Ni—P | 150 | 217° C. | Copper member side | Ti |
| Invention Example 8 | Sn—0.7 mass % Cu | 150 | 227° C. | Copper member side | Ti |
| Invention Example 9 | Al—33 mass % Cu | 100 | 548° C. | Copper member side | Ti |
| Invention Example 10 | Cu—7 mass % P—15 mass % Sn—10 mass % Ni | 20 | 580° C. | Ceramic substrate side | Ti |
| Invention Example 11 | Cu—7 mass % P—15 mass % Sn—10 mass % Ni | 20 | 580° C. | Copper member side | Ti |

| | Thickness of active metal material μm | Material of metal layer | Heating conditions Temperature | Heating conditions Time | Initial bonding area % | Bonding rate after thermal cycle test % |
|---|---|---|---|---|---|---|
| Invention Example 1 | 3 | Cu | 650° C. | 60 minutes | 99.6 | 93.8 |
| Invention Example 2 | 3 | Cu | 650° C. | 60 minutes | 99.8 | 97.9 |
| Invention Example 3 | 3 | Cu | 650° C. | 30 minutes | 98.9 | 97.2 |
| Invention Example 4 | 3 | Cu | 650° C. | 90 minutes | 99.2 | 96.1 |
| Invention Example 5 | 3 | Cu | 650° C. | 90 minutes | 100 | 99.3 |
| Invention Example 6 | 10 | Cu | 750° C. | 60 minutes | 99.7 | 97.8 |
| Invention Example 7 | 10 | Cu | 560° C. | 300 minutes | 98.2 | 88.4 |
| Invention Example 8 | 10 | Cu | 560° C. | 360 minutes | 98.4 | 90.7 |
| Invention Example 9 | 15 | Cu | 600° C. | 60 minutes | 98.0 | 89.5 |
| Invention Example 10 | 3 | Cu | 650° C. | 60 minutes | 99.6 | 86.0 |
| Invention Example 11 | 3 | Al | 650° C. | 60 minutes | 100 | 98.5 |

In Invention Examples 1 to 11 in which the filler metal having a melting point of 710° C. or lower was used, it was confirmed that the initial bonding rates were high, high bonding rates were maintained even after the thermal cycle was loaded, and power-module substrates could be obtained.

REFERENCE SIGNS LIST

10, 110 POWER-MODULE SUBSTRATE
11 CERAMIC SUBSTRATE (CERAMIC MEMBER)
12, 112 CIRCUIT LAYER (COPPER MEMBER)
13 METAL LAYER (COPPER MEMBER)
25, 225 FILLER METAL
26, 226 ACTIVE METAL MATERIAL
113 METAL LAYER
211 CERAMIC MEMBER
222 COPPER MEMBER

INDUSTRIAL APPLICABILITY

The present invention relates to a method for manufacturing a power-module substrate in which a ceramic member and a copper member can be bonded together at a low temperature and, furthermore, the manufacturing cost is low.

The invention claimed is:

1. A method for manufacturing a bonded body formed by bonding a ceramic member made of a ceramic member and a copper member made of copper or a copper alloy, the method comprising:
    a lamination step of laminating the ceramic member and the copper member through an active metal material and a filler metal having a melting point of 710° C. or lower; and
    a heating treatment step of heating the ceramic member and the copper member laminated together to bond the ceramic member and the copper member in a state of being pressurized in the lamination direction at 1 kgf/cm² to 35 kgf/cm²,
wherein the filler metal is a brazing filler metal,
the brazing filler metal is any one selected from the group of a Cu—P-based brazing filler metal, a Cu—Sn-based brazing filler metal, and a Cu—Al-based brazing filler metal,
the filler metal does not contain Ag and does not come into direct contact with the copper member, and
a heating temperature in the heating treatment step is 560° C. to 650° C.

2. The method for manufacturing a bonded body according to claim 1,
wherein the filler metal is disposed on the ceramic member, and the active metal material is disposed on the copper member in the lamination step.

3. The method for manufacturing a bonded body according to claim 2,
wherein a thickness of the filler metal is 5 μm to 150 μm.

4. The method for manufacturing a bonded body according to claim 2,
wherein a thickness of the active metal material is 1 μm to 20 μm.

5. The method for manufacturing a bonded body according to claim 1,
wherein the brazing filler metal has a liquidus temperature of 450° C. or higher.

6. The method for manufacturing a bonded body according to claim 1,
wherein the brazing filler metal is the Cu—P-based brazing filler metal or the Cu—Al-based brazing filler metal.

7. The method for manufacturing a bonded body according to claim 1,
wherein the active metal material is a Ti material.

8. A method for manufacturing a power-module substrate having a ceramic substrate and a circuit layer made of copper or a copper alloy, the circuit layer being disposed on one surface of the ceramic substrate, the method comprising
bonding the circuit layer onto the one surface of the ceramic substrate using the method for manufacturing a bonded body according to claim 1.

9. A method for manufacturing a power-module substrate having a ceramic substrate, a circuit layer made of copper or a copper alloy, and a metal layer made of copper or a copper alloy, the circuit layer being disposed on one surface of the ceramic substrate, and the metal layer being disposed on another surface of the ceramic substrate, the method comprising:
bonding the circuit layer and the metal layer onto both surfaces of the ceramic substrate respectively using the method for manufacturing a bonded body according to claim 1.

10. A method for manufacturing a power-module substrate having a ceramic substrate, a circuit layer made of copper or a copper alloy, and a metal layer made of aluminum or an aluminum alloy, the circuit layer being disposed on one surface of the ceramic substrate, and the metal layer being disposed on another surface of the ceramic substrate, the method comprising:
bonding the circuit layer onto the one surface of the ceramic substrate using the method for manufacturing a bonded body according to claim 1, and
bonding the metal layer onto the other surface of the ceramic substrate after bonding the ceramic substrate and the circuit layer.

11. The method for manufacturing a bonded body according to claim 2,
wherein the brazing filler metal has a liquidus temperature of 450° C. or higher.

12. The method for manufacturing a bonded body according to claim 11,
wherein the brazing filler metal is the Cu—P-based brazing filler metal or the Cu—Al-based brazing filler metal.

13. A method for manufacturing a bonded body formed by bonding a ceramic member made of a ceramic member and a copper member made of copper or a copper alloy, the method comprising:
a lamination step of laminating the ceramic member and the copper member through an active metal material and a filler metal having a melting point of 710° C. or lower; and
a heating treatment step of heating the ceramic member and the copper member laminated together to bond the ceramic member and the copper member in a state of being pressurized in the lamination direction at 1 kgf/cm² to 35 kgf/cm²,
wherein the filler metal is a solder material,
the solder material is a Cu—P—Sn—Ni-based solder material or a Cu—Sn-based solder material,
the filler metal does not contain Ag,
the solder material has a liquidus temperature of lower than 450° C., and
a heating temperature in the heating treatment step is 560° C. to 650° C.

14. The method for manufacturing a bonded body according to claim 13,
wherein the filler metal is disposed on the ceramic member, and the active metal material is disposed on the copper member in the lamination step.

15. The method for manufacturing a bonded body according to claim 14,
wherein the solder material is the Cu—P—Sn—Ni-based solder material.

16. The method for manufacturing a bonded body according to claim 14,
wherein a thickness of the filler metal is 5 μm to 150 μm.

17. The method for manufacturing a bonded body according to claim 14,
wherein a thickness of the active metal material is 1 μm to 20 μm.

18. The method for manufacturing a bonded body according to claim 13,
wherein the solder material is the Cu—P—Sn—Ni-based solder material.

19. The method for manufacturing a bonded body according to claim 13,
wherein the active metal material is a Ti material.

20. The method for manufacturing a bonded body according to claim 13,
wherein a heating time in the heating treatment step is 30 minutes to 360 minutes.

21. A method for manufacturing a power-module substrate having a ceramic substrate and a circuit layer made of copper or a copper alloy, the circuit layer being disposed on one surface of the ceramic substrate, the method comprising
bonding the circuit layer onto the one surface of the ceramic substrate using the method for manufacturing a bonded body according to claim 13.

22. A method for manufacturing a power-module substrate having a ceramic substrate, a circuit layer made of copper or a copper alloy, and a metal layer made of copper or a copper alloy, the circuit layer being disposed on one surface of the ceramic substrate, and the metal layer being disposed on another surface of the ceramic substrate, the method comprising:
  bonding the circuit layer and the metal layer onto both surfaces of the ceramic substrate respectively using the method for manufacturing a bonded body according to claim 13.

23. A method for manufacturing a power-module substrate having a ceramic substrate, a circuit layer made of copper or a copper alloy, and a metal layer made of aluminum or an aluminum alloy, the circuit layer being disposed on one surface of the ceramic substrate, and the metal layer being disposed on another surface of the ceramic substrate, the method comprising:
  bonding the circuit layer onto the one surface of the ceramic substrate using the method for manufacturing a bonded body according to claim 13, and
  bonding the metal layer onto the other surface of the ceramic substrate after bonding the ceramic substrate and the circuit layer.

\* \* \* \* \*